(12) United States Patent
Eom (10) Patent No.: US 8,916,977 B2
(45) Date of Patent: Dec. 23, 2014

(54) SEMICONDUCTOR DEVICE AND METHOD FOR FABRICATING THE SAME

(75) Inventor: Dae-Sung Eom, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 117 days.

(21) Appl. No.: 13/602,374

(22) Filed: Sep. 4, 2012

(65) Prior Publication Data
US 2013/0241085 A1    Sep. 19, 2013

(30) Foreign Application Priority Data
Mar. 16, 2012    (KR) .................. 10-2012-0027047

(51) Int. Cl.
| H01L 23/52 | (2006.01) |
| H01L 23/48 | (2006.01) |
| H01L 21/768 | (2006.01) |

(52) U.S. Cl.
CPC ................... H01L 23/481 (2013.01)
USPC ............ 257/774; 257/E23.011; 257/E21.575

(58) Field of Classification Search
CPC .................................................. H01L 23/481
USPC ........................... 257/774, E23.011, E21.575
See application file for complete search history.

(56) References Cited

U.S. PATENT DOCUMENTS

| 6,853,029 | B2 * | 2/2005 | Ichige et al. ................... 257/316 |
| 7,132,717 | B2 * | 11/2006 | Su et al. ......................... 257/401 |
| 7,394,696 | B2 | 7/2008 | Lee et al. |
| 7,570,517 | B2 * | 8/2009 | Kwak et al. .............. 365/185.17 |
| 7,733,698 | B2 * | 6/2010 | Deppe et al. ............. 365/185.17 |
| 7,778,058 | B2 * | 8/2010 | Kim ................. 365/63 |
| 7,977,186 | B2 * | 7/2011 | Ito .................. 438/257 |
| 2009/0315187 | A1 * | 12/2009 | Cho et al. ...................... 257/773 |
| 2012/0286358 | A1 * | 11/2012 | Sammi ......................... 257/334 |

* cited by examiner

*Primary Examiner* — Luan C Thai
(74) *Attorney, Agent, or Firm* — IP & T Group LLP

(57) ABSTRACT

A semiconductor device includes a semiconductor substrate configured to include a plurality of active regions that are stretched in parallel to each other, a plurality of first contact plugs and the plurality of active regions, wherein each active region is coupled with a corresponding first contact plug, and a contact pad configured to couple with a given number of first contact plugs among the plurality of first contact plugs. Misalignment occurring at the ends of a series of drain contacts may be prevented, and the size of well-pickup contacts may be decreased by forming contact plugs that are coupled with drain regions with the same distance to a well-pickup contact region without additionally forming well-pickup contact plugs and using the contact plugs as well-pickup contact plugs. Therefore, loss of a substrate may be minimized, and burden of Optical Proximity Correction (OPC) is relieved, reducing Turn-Around Time (TAT).

20 Claims, 11 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2012-0027047, filed on Mar. 16, 2012, which is incorporated herein by reference in its entirety.

BACKGROUND

1. Field

Exemplary embodiments of the present invention relate to a semiconductor device and a fabrication method thereof, and more particularly, to a semiconductor device having a well-pickup contact structure and a method for fabricating the semiconductor device.

2. Description of the Related Art

Semiconductor device, such as non-volatile memory devices, includes patterns for applying a bias voltage to operate memory cells. For example, a NAND flash memory device includes memory cells that are coupled serially, selection transistors that are coupled on both sides of the memory cells, and a structure for applying a predetermined bias to wells formed in active regions of a semiconductor substrate where the memory cells and the selection transistors are disposed.

Figure 1A:
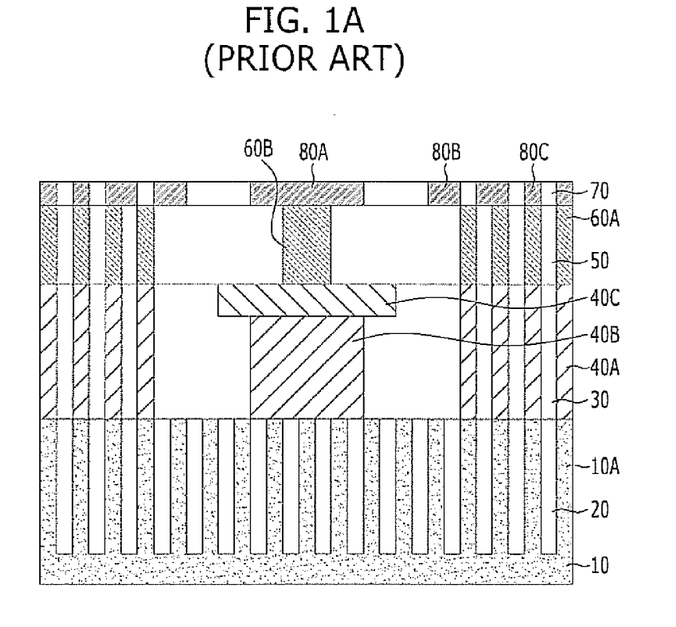
FIGS. 1A and 1B illustrate a conventional semiconductor device and a method for fabricating the semiconductor device.
Figure 1B:
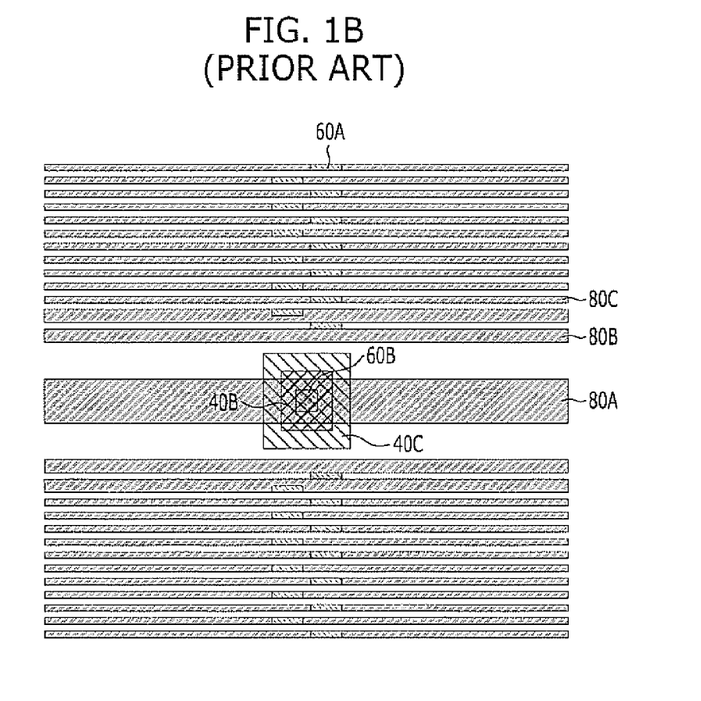

FIGS. 1A and 1B illustrate a conventional semiconductor device, and a method for fabricating the semiconductor device.

Referring to FIGS. 1A and 1B, an isolation layer 20 is formed over a substrate 10 to define a plurality of active regions 10A that are stretched in parallel to each other, and then a first insulation layer 30 is formed over the active regions 10A and the isolation layer 20.

Subsequently, first drain contact plugs 40A are formed to be coupled with drain regions through the first insulation layer 30, and a first well-pickup contact plug 40B is formed to be coupled with well-pickup regions. Also, a well-pickup contact pad 40C is formed to be coupled with the first well-pickup contact plug 40B, and a second insulation layer 50 is formed over the resultant substrate including the first drain contact plugs 40A, the first well-pickup contact plug 40B, and the well-pickup contact pad 40C.

Subsequently, second drain contact plugs 60A coupled with the first drain contact plugs 40A through the second insulation layer 50 and a second well-pickup contact plug 60B coupled with the well-pickup contact pad 40C are formed, and then a third insulation layer 70 is formed over the resultant substrate including the second drain contact plugs 60A and the second well-pickup contact plug 60B. Subsequently, a conductive pad 80A that is coupled with the second well-pickup contact plug 60B through the third insulation layer 70, dummy lines 80B on both sides of the conductive pad 80A, and conductive lines 80C coupled with the second drain contact plugs 60A are formed.

Since the first well-pickup contact plug 40B is formed between the first drain contact plugs 40A according to conventional technology, misalignments may be caused between a series of the first drain contact plugs 40A. In particular, as the first well-pickup contact plug 40B may be enlarged in size, substrate loss and chip size may be increased.

SUMMARY

Exemplary embodiments of the present invention are directed to a semiconductor device having a well-pickup contact structure that may prevent misalignment occurring at the ends of a series of drain contacts, decrease chip size, and a method for fabricating the semiconductor device.

In accordance with an exemplary embodiment of the present invention, a semiconductor device includes a semiconductor substrate configured to include a plurality of active regions that are stretched in parallel to each other, a plurality of first contact plugs and the plurality of active regions, wherein each active region is coupled with a corresponding first contact plug, and a contact pad configured to couple with a given number of first contact plugs among the plurality of first contact plugs.

In accordance with another exemplary embodiment of the present invention, a method for fabricating a semiconductor device includes forming an isolation layer for defining a plurality of active regions that are stretched in parallel to each other over a semiconductor substrate, forming a plurality of first contact plugs so that each active region is coupled with a corresponding first contact plug, and forming a contact pad for coupling with a given number of first contact plugs among the plurality of first contact plugs.

BRIEF DESCRIPTION OF THE DRAWINGS

FIGS. 2A to 6B illustrate a semiconductor device and a method for fabricating the semiconductor device in accordance with a first embodiment of the present invention.

FIGS. 7A to 11B illustrate a semiconductor device and a method for fabricating the semiconductor device in accordance with a second embodiment of the present invention.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 4A:
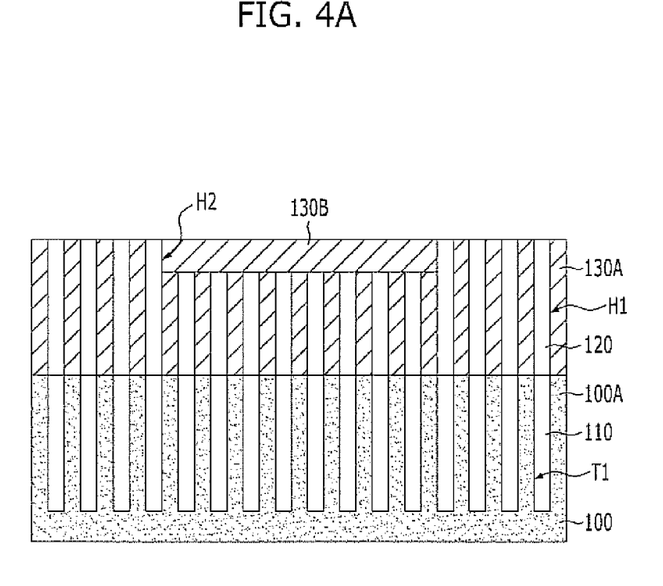
Figure 4B:
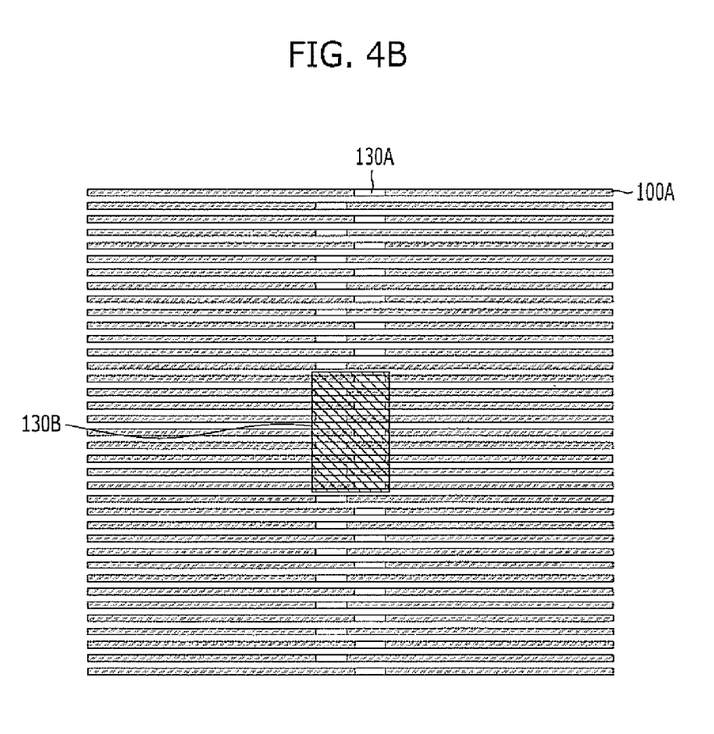
Figure 5A:
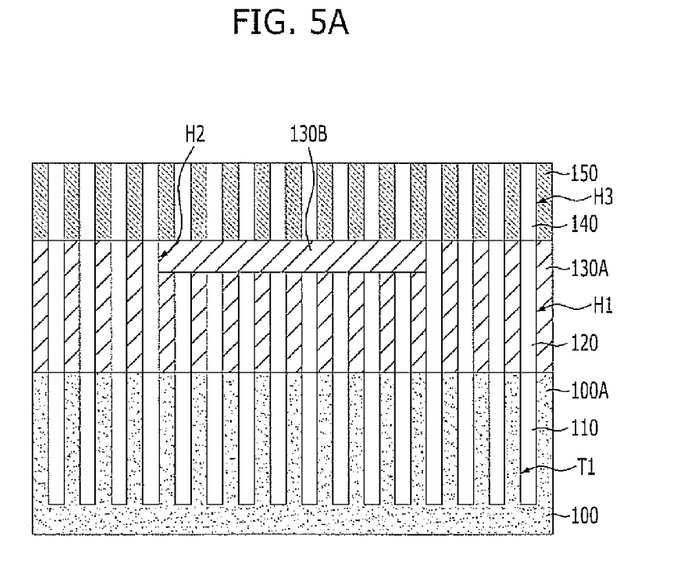
Figure 5B:
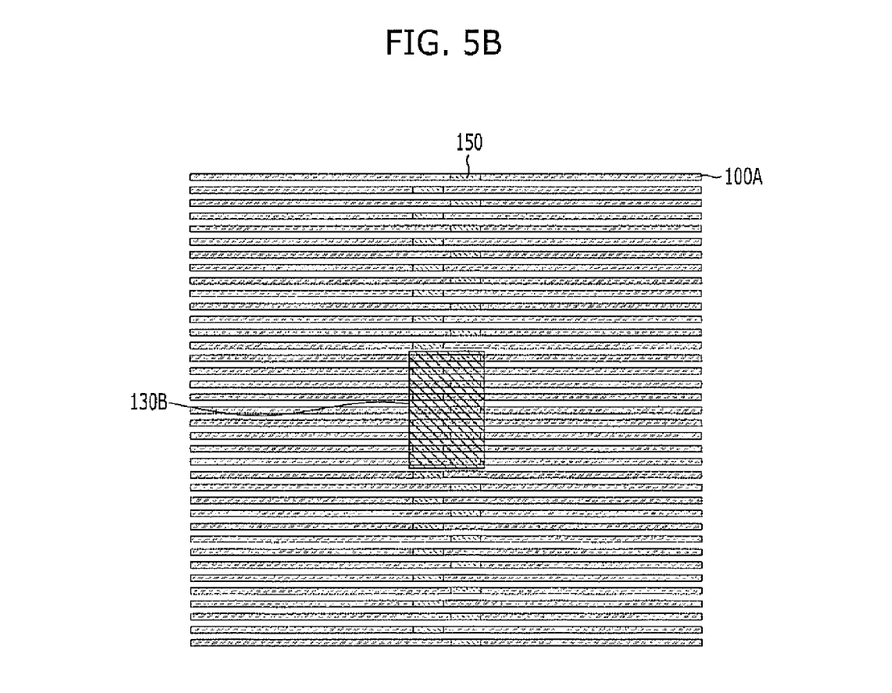
Figure 6A:
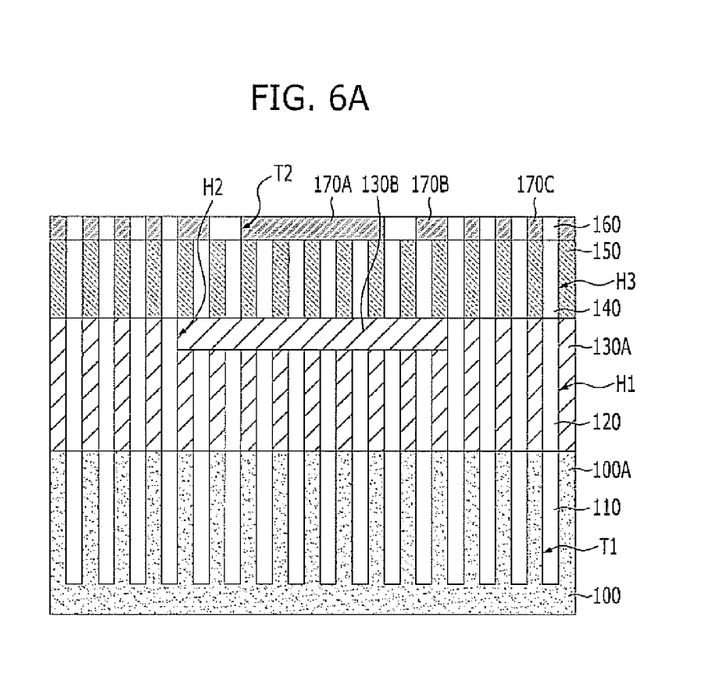
Figure 6B:
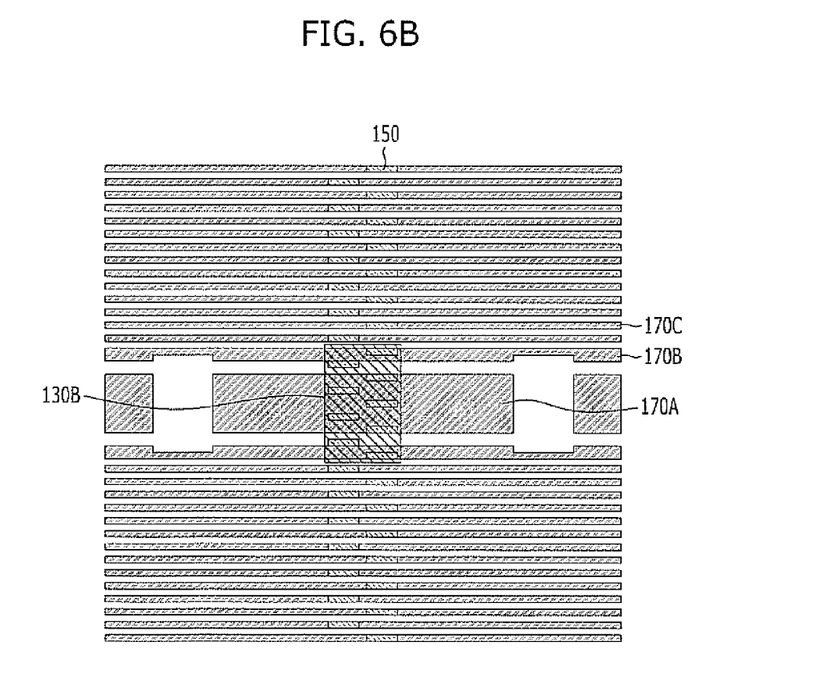

FIGS. 2A to 6B illustrate a semiconductor device and a method for fabricating the semiconductor device in accordance with a first embodiment of the present invention. Particularly, FIGS. 6A and 6B illustrate the semiconductor device in accordance with the first embodiment of the present invention, and FIGS. 2A to 5B exemplarily illustrate an intermediate process for fabricating the device of FIGS. 6A and 6B. FIGS. 2A, 3A, 4A, 5A and 6A are cross-sectional views taken in a vertical direction from a substrate, while FIGS. 2B, 3B, 4B, 5B and 6B are plan views of layout.

Figure 2A:
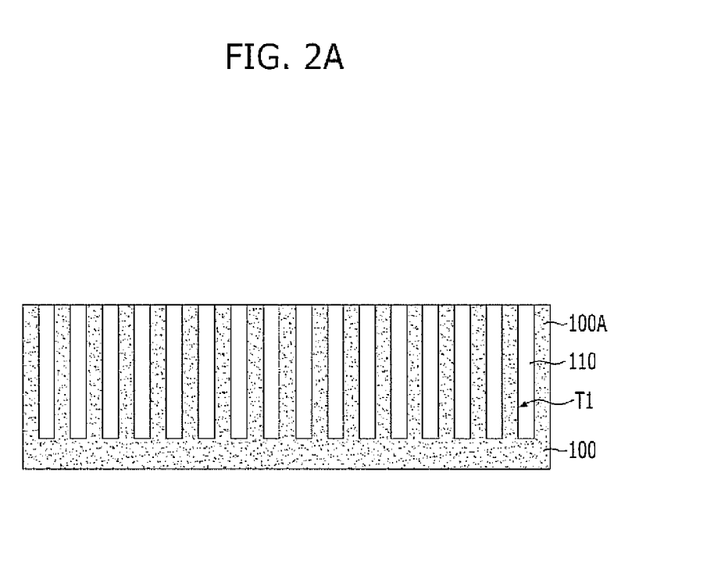
Figure 2B:
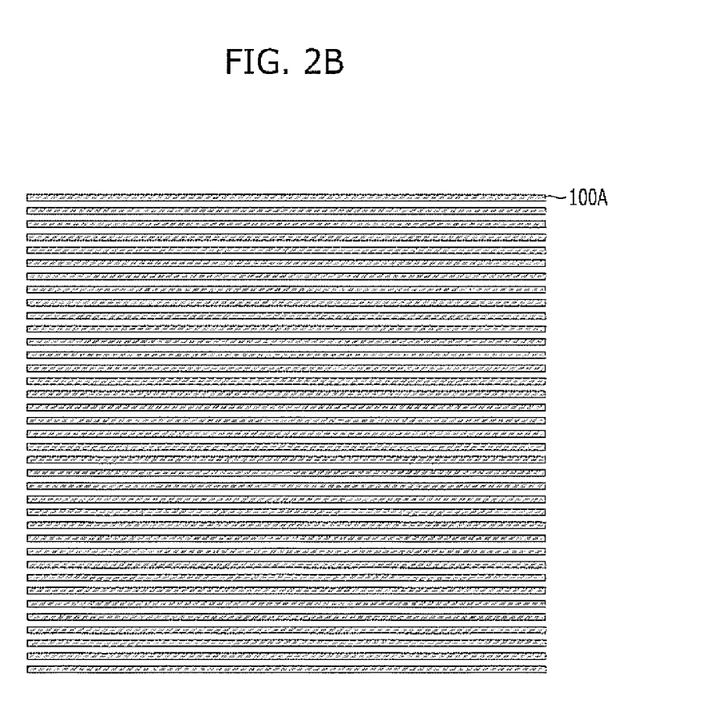

Referring to FIGS. 2A and 2B, a mask pattern (not shown) having a shape of lines that are stretched in one direction is formed over a substrate 100, and then first trenches T1 are formed by using the mask pattern (not shown) as an etch mask and etching a portion of the substrate 100.

The substrate 100 may be a semiconductor substrate such as a monocrystalline silicon substrate, and the substrate 100 may include a given understructure (not shown). Also, the first trenches T1 may have a shape of slits that are stretched in one direction, and a plurality of first trenches T1 may be arrayed in parallel to each other.

Subsequently, an isolation layer 110 is formed by filling the first trenches T1 with an isolation material through at least one of following processes: a Spin-On Dielectric (SOD) process, a high aspect ratio process (HARP), and a high density plasma (HDP) process. As a result, the isolation layer 110 defines a plurality of active regions 100A that are stretched in parallel to each other.

Figure 3A:
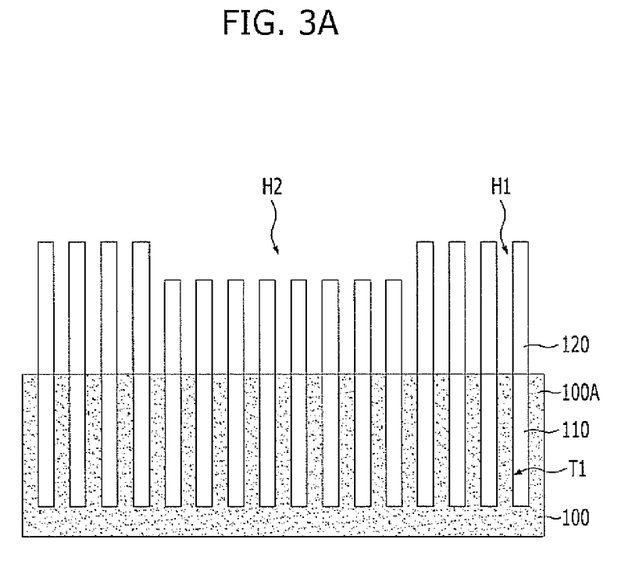
Figure 3B:
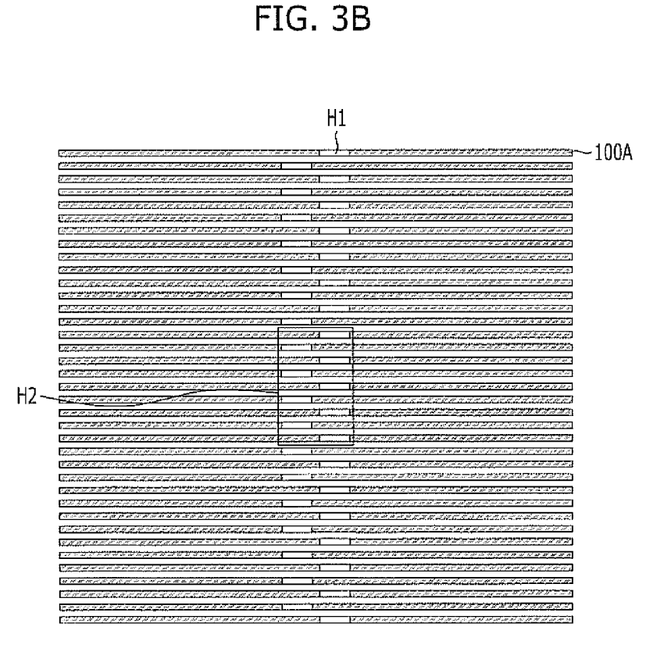

Referring to FIGS. 3A and 3B, a first insulation layer 120 is formed over the active regions 100A and the isolation layer 110. The first insulation layer 120 may include at least any one of oxide-based materials, such as silicon oxide ($SiO_2$), tetra ethyl ortho silicate (TEOS), boron silicate glass (BSG), phosphorus silicate glass (PSG), fluorinated silicate glass (FSG), boron phosphorus silicate glass (BPSG), and spin on glass (SOG).

Subsequently, a plurality of first contact holes H1 that expose part of the active regions 100A, for example, drain regions, may be formed by selectively etching the first insulation layer 120.

The first contact holes H1 are arrayed in rows that are stretched in a direction crossing the active regions 100A, where neighboring first contact holes H1 are disposed in different rows to secure the process margin while reducing parasitic capacitance between first contact plugs, which are to be described later. In particular, misalignment occurring at the ends of well-pickup contact plugs may be prevented by arraying the first contact holes H1 with the same space without having an additional space for forming well-pickup contact plugs.

Subsequently, grooves H2 for defining a space where a well-pickup contact pad is to be formed are formed by selectively etching a portion of the first insulation layer 120 where the first contact holes H1 are formed. The grooves H2 may be formed to overlap with the first contact holes H1 of a well-pickup contact region.

Referring to FIGS. 4A and 4B, the first contact plugs 130A in the inside of the first contact holes H1 and the well-pickup contact pads 130B in the inside of the grooves H2 may be formed by depositing a conductive material, e.g., doped polysilicon, metal, or a metal nitride, in a thickness that may fill the first contact holes H1 and the grooves H2 and then performing a planarization process, such as a Chemical Mechanical Polishing (CMP) process, until the upper surface of the first insulation layer 120 is exposed. The space between the well-pickup contact pads 130B and the first contact plugs 130A that are adjacent to the well-pickup contact pads 130B on the right and left sides may be the same as the space between the first contact plugs 130A. Meanwhile, the first contact plugs 130A that are formed as a result of the process serve as well-pickup contact plugs for applying a bias voltage to wells (not shown) formed in the active regions 100A or source/drain contact plugs.

Particularly, well-pickup contact resistance may be decreased while sufficiently securing process margin by coupling the upper ends of the first contact plugs 130A of the well-pickup contact region with the well-pickup contact pads 130B. Although nine first contact plugs 130A are used to illustrate coupling with the well-pickup contact pads 130B in the drawings, this is not restrictive but illustrative only, and more or less than nine first contact plugs 130A may be coupled with the well-pickup contact pads 130B.

Referring to FIGS. 5A and 5B, a second insulation layer 140 is formed over the substrate structure where the first contact plugs 130A and well-pickup contact pads 130B are formed. The second insulation layer 140 may include an oxide-based material, such as silicon oxide layer ($SiO_2$), TEOS, BSG, PSG, FSG, BPSG, and SOG.

Subsequently, a plurality of second contact holes H3 that expose a portion of the well-pickup contact pads 130B or the first contact plugs 130A not coupled with the well-pickup contact pads 130B are formed by selectively etching the second insulation layer 140. The second contact holes H3 are arrayed in rows that are stretched in a direction crossing the active regions 100A. From the perspective of a plane, the second contact holes H3 may be formed with the same positions as the first contact holes H1.

Subsequently, second contact plugs 150 are formed in the inside of the second contact holes H3. The second contact plugs 150 may be formed by depositing a conductive material, such as doped polysilicon, metal, or metal nitride, in a thickness that fills the second contact holes H3 and then performing a planarization process, such as Chemical Mechanical Polishing (CMP) process until the upper surface of the second insulation layer 140 is exposed. The second contact plugs 150 may be formed over the first contact plugs 130A.

Referring to FIGS. 6A and 6B, a third insulation layer 160 is formed over the second insulation layer 140 and the second contact plugs 150. The third insulation layer 160 may include at least one of following: silicon oxide layer ($SiO_2$), TEOS, BSG, PSG, FSG, BPSG, and SOG.

Subsequently, a mask pattern (not shown) having a shape of lines that are stretched with the same direction as the active regions 100A and expose the second contact plugs 150 is formed, and then second trenches T2 are formed by using the mask pattern and etching the third insulation layer 160. The mask pattern may be formed through a Spacer Patterning Technology (SPT) process to form delicate mask pattern.

The second trenches T2 may have a shape of slits that are stretched in one direction, and the second trenches T2 may be arrayed in parallel to each other. Particularly, the second trenches T2 over the well-pickup contact pads 130B are formed to have a width as wide as to simultaneously expose the second contact plugs 150 and to be isolated from each other with a given space along a longitudinal direction.

Subsequently, conductive patterns, which include conductive pads 170A, dummy lines 170B, and conductive lines 170C, are formed in the inside of the second trenches T2. The conductive pads 170A are coupled with the second contact plugs 150, which are coupled with the well-pickup contact pads 130B. The dummy lines 170B are formed on both sides of each conductive pad 170A to secure process margin. The conductive lines 170C are coupled with the second contact plugs 150, which are coupled with the first contact plugs 130A.

The conductive pads 170A, the dummy lines 170B, and the conductive lines 170C may be formed by depositing a conductive material, such as doped polysilicon, metal, or metal nitride, in a thickness to fill the second trenches T2, and performing a planarization process, such as a CMP process, until the upper surface of the third insulation layer 160 is exposed. Although the drawings illustrate five second contact plugs 150 coupled with the conductive pads 170A, this is not restrictive but illustrative only, and more or less than five second contact plugs 150 may be coupled with the conductive pads 170A.

Through the fabrication method described above, the semiconductor device in accordance with the first embodiment of the present invention illustrated in FIGS. 6A and 6B may be fabricated.

Referring to FIGS. 6A and 6B, the semiconductor device in accordance with the first embodiment of the present invention may include the substrate 100, the first contact plugs 130A, the well-pickup contact pads 130B, the second contact plugs 150, and conductive patterns. The substrate 100 includes multiple active regions 100A that are stretched in parallel to each other. The first contact plugs 130A are arrayed with the same space between them while being coupled with the active regions 100A, respectively. The well-pickup contact pads 130B are coupled with the upper ends of the first contact plugs 130A that are formed in the well-pickup contact region among the first contact plugs 130A. The second contact plugs 150 are arrayed with the same space between them while being coupled with the well-pickup contact pads 130B or the first contact plugs 130A that are not coupled with the well-pickup contact pads 130B. The conductive patterns are coupled with the second contact plugs 150.

The first contact plugs 130A may be coupled with the drain regions of the active regions 100A. The first contact plugs 130A are arrayed in a plurality of rows that are stretched in a direction crossing the active regions 100A, where neighboring first contact plugs 130A may be disposed in different rows. Also, the space between the well-pickup contact pads 130B and the first contact plugs 130A that are adjacent to the right and left sides of the well-pickup contact pads 130B may be the same as the space between the first contact plugs 130A.

The second contact plugs 150 may be disposed over the first contact plugs 130A, and the conductive patterns may include the conductive pads 170A, the dummy lines 170B, and the conductive lines 170C.

FIGS. 7A to 11B illustrate a semiconductor device and a method for fabricating the semiconductor device in accordance with a second embodiment of the present invention. FIGS. 7A, 8A, 9A, 10A, and 11A are cross-sectional views of a vertical direction from the substrate, and FIGS. 7B, 8B, 9B, 10B and 11B are plan views showing layouts thereof. In the following description of the second embodiment, description on the parts that are substantially the same as the above-described first embodiment are omitted.

Figure 7A:
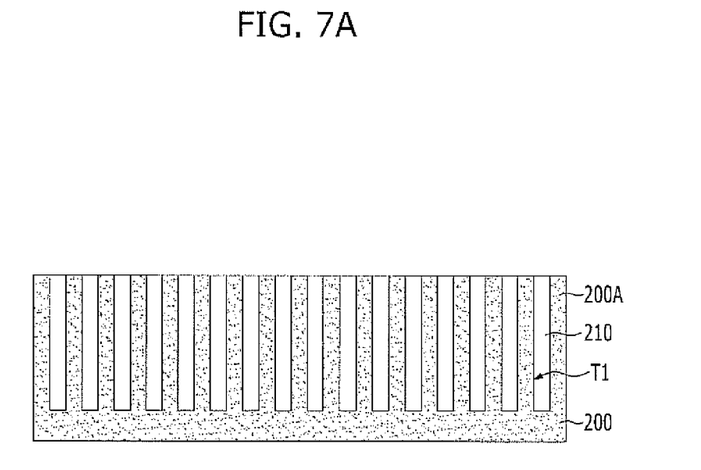
Figure 7B:
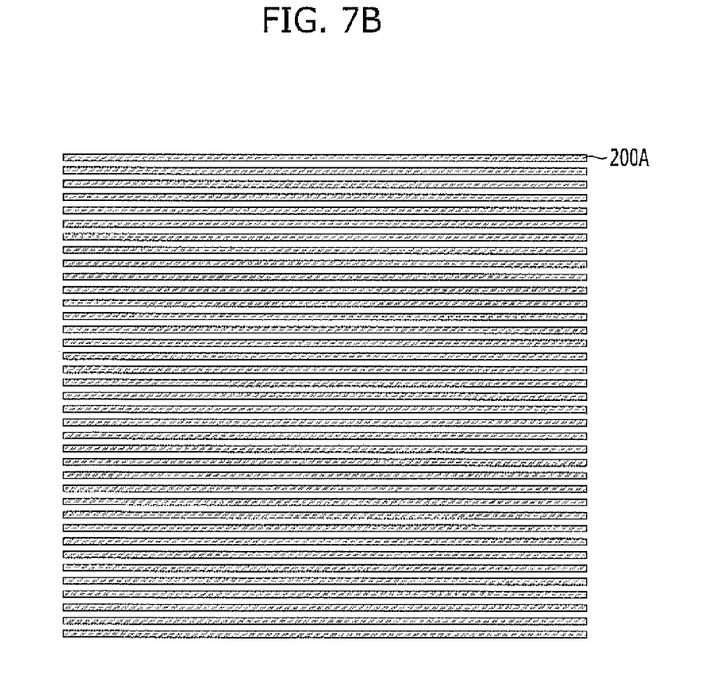

Referring to FIGS. 7A and 7B, a mask pattern (not shown) having a shape of lines that are stretched in one direction is formed over a substrate 200, and then first trenches T1 are formed by using the mask pattern (not shown) as an etch mask and etching a portion of the substrate 200. The substrate 200 may be a semiconductor substrate such as a monocrystalline silicon substrate. The first trenches T1 may have a shape of slits that are stretched in one direction, and a plurality of first trenches T1 may be arrayed in parallel to each other.

Subsequently, an isolation layer 210 is formed by filling the first trenches T1 with an isolation material through at least any one of following: a Spin-On Dielectric (SOD) process, a high aspect ratio process (HARP), and a high density plasma (HDP) process. As a result, the isolation layer 210 defines a plurality of active regions 200A that are stretched in parallel to each other.

Figure 8A:
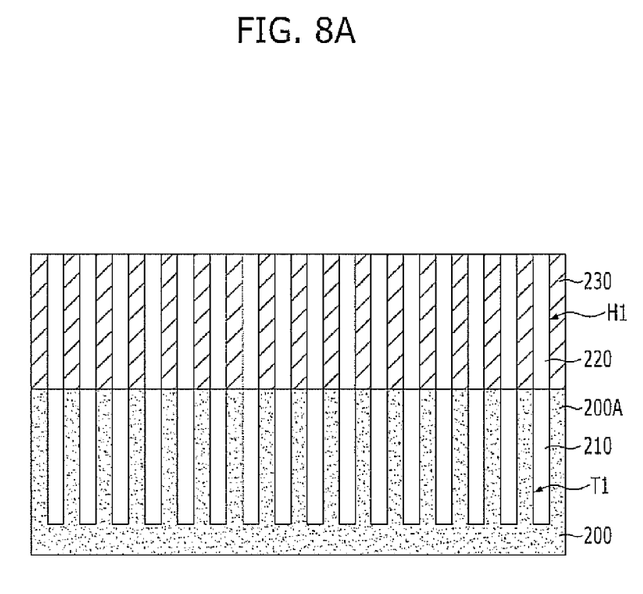
Figure 8B:
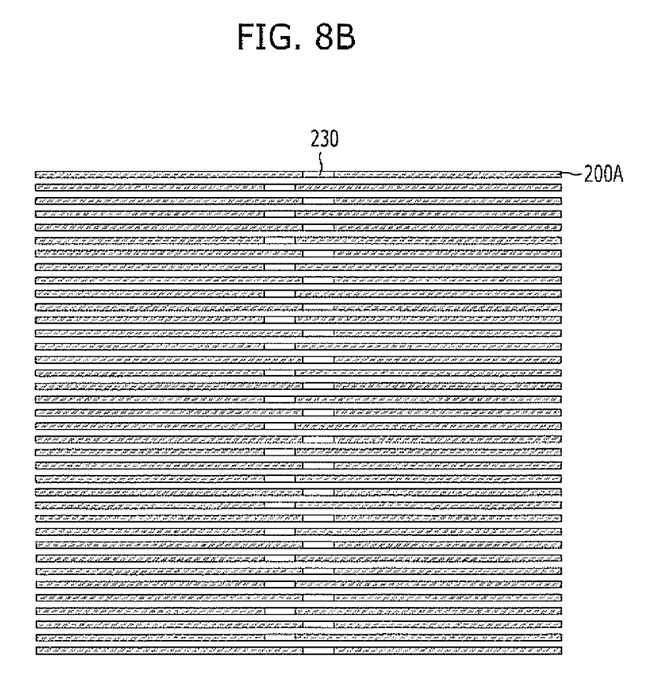

Referring to FIGS. 8A and 8B, a first insulation layer 220 is formed over the active regions 200A and the isolation layer 210, and then a plurality of first contact holes H1 that expose part of the active regions 200A, for example, drain regions, may be formed by selectively etching the first insulation layer 220. The first contact holes H1 are arrayed in rows that are stretched in a direction crossing the active regions 200A.

Subsequently, first contact plugs 230 are formed in the inside of the first contact holes H1. The first contact plugs 230 may be formed by depositing a conductive material, e.g., doped polysilicon, metal, or a metal nitride, in a thickness that may fill the first contact holes H1 and then performing a planarization process, such as a Chemical Mechanical Polishing (CMP) process, until the upper surface of the first insulation layer 220 is exposed.

Figure 9A:
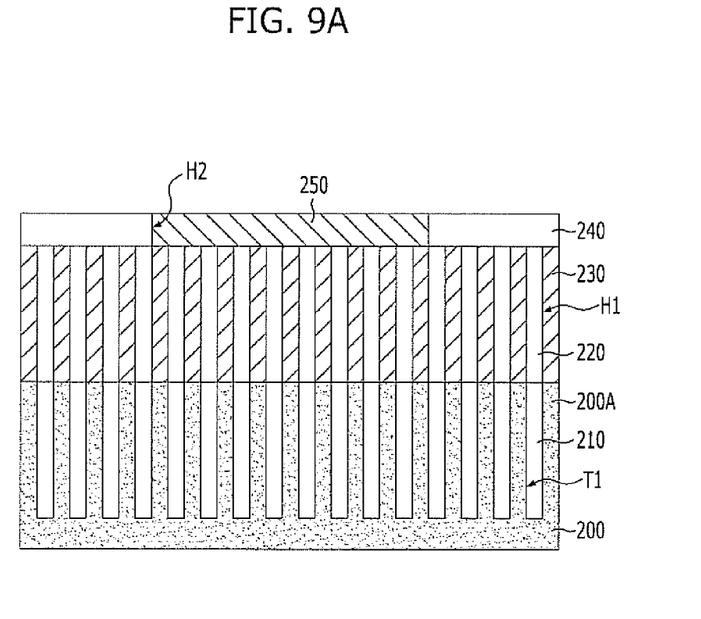
Figure 9B:
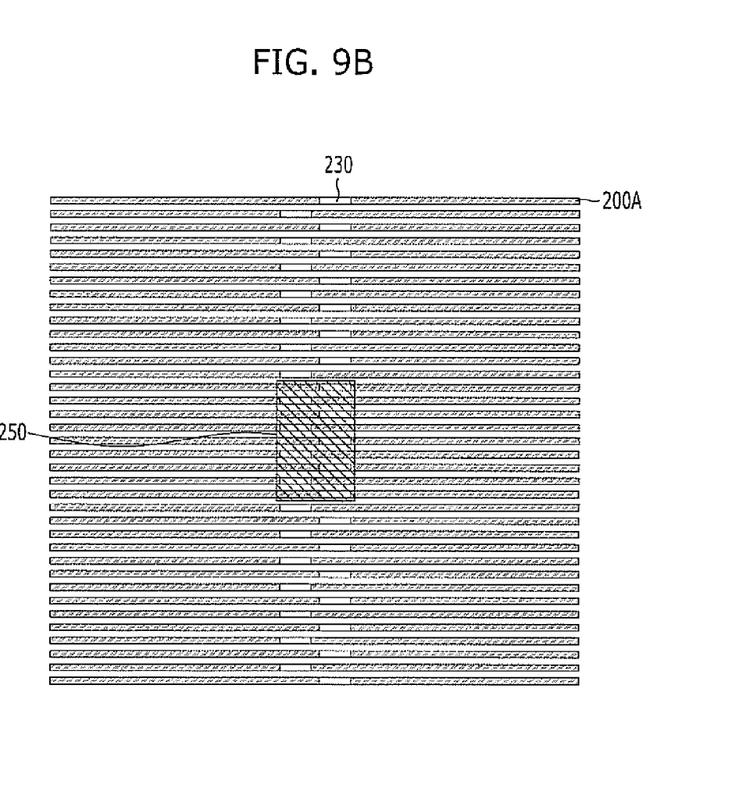

Referring to FIGS. 9A and 9B, a second insulation layer 240 is formed over the first insulation layer 220 and the first contact plugs 230, and then grooves H2 that expose a well-pickup contact region for applying a bias voltage to wells (not shown) that are formed in the active regions 200A are formed by selectively etching the second insulation layer 240. The grooves H2 expose the first contact plugs 230 that are to be used as well-pickup contact plugs and define a space where well-pickup contact pads are to be formed. The well-pickup contact pads are to be described later.

Subsequently, well-pickup contact pads 250 are formed in the inside of the grooves H2. The well-pickup contact pads 250 may be formed by depositing a conductive material, such as doped polysilicon, metal, or metal nitride, in a thickness that fills the grooves H2 and then performing a planarization process, such as a CMP process, until the upper surface of the second insulation layer 240 is exposed. Meanwhile, the first contact plugs 230 in the well-pickup contact region may be coupled with each other through the well-pickup contact pads 250.

Figure 10A:
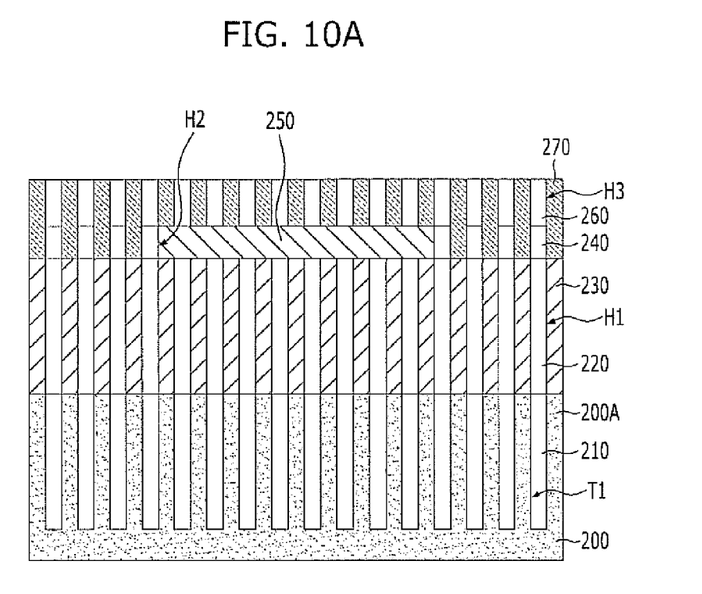
Figure 10B:
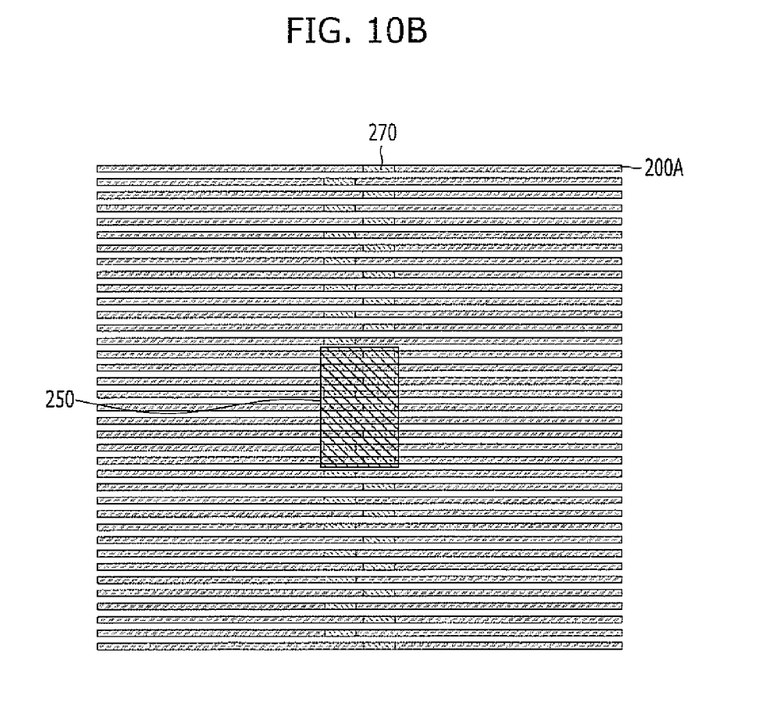

Referring to FIGS. 10A and 10B, a third insulation layer 260 is formed over the second insulation layer 240 and the well-pickup contact pads 250, and then a plurality of second contact holes H3 that expose a portion of the well-pickup contact pads 250 or the first contact plugs 230 not coupled with the well-pickup contact pads 250 are formed by selectively etching the second insulation layer 240 and the third insulation layer 260. The second contact holes H3 are arrayed with the same space between them in more than two rows that are stretched in a direction crossing the active regions 200A. From the perspective of a plane, the second contact holes H3 may be formed with the same positions as the first contact holes H1.

Subsequently, second contact plugs 270 are formed in the inside of the second contact holes H3. The second contact plugs 270 may be formed by depositing a conductive material, such as doped polysilicon, metal, or metal nitride, in a thickness that fills the second contact holes H3 and then performing a planarization process, such as Chemical Mechanical Polishing (CMP) process, until the upper surface of the third insulation layer 260 is exposed.

Figure 11A:
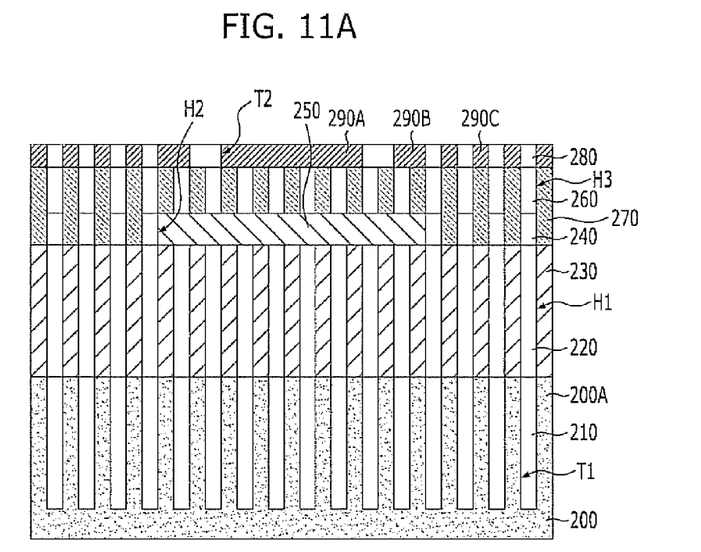
Figure 11B:
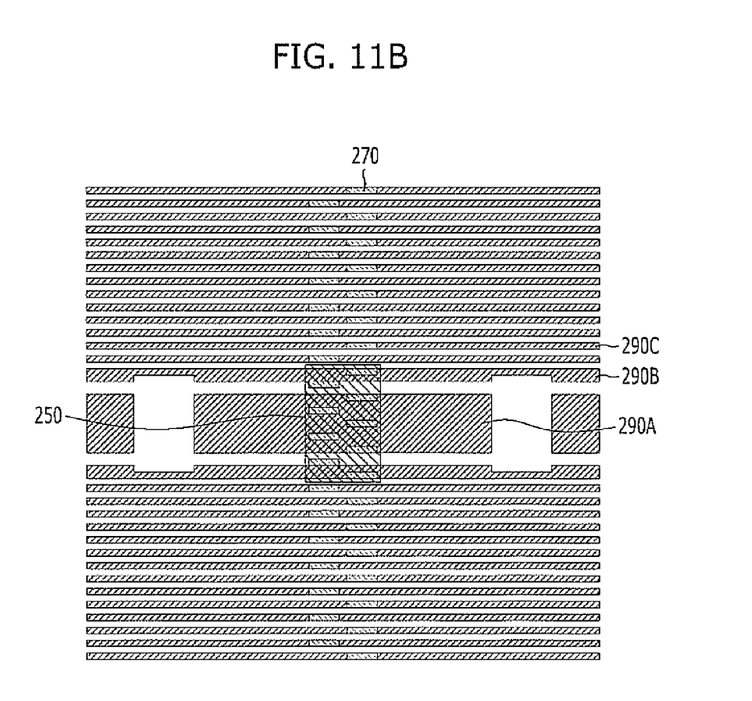

Referring to FIGS. 11A and 11B, a fourth insulation layer 280 is formed over the third insulation layer 260 and the second contact plugs 270, and then second trenches T2 that expose the second contact plugs 270 while being stretched in the same direction as the active regions 200A are formed by selectively etching the fourth insulation layer 280. The second trenches T2 may have a shape of slits that are stretched in one direction, and a plurality of the second trenches T2 may be arrayed in parallel to each other.

Subsequently, conductive patterns, such as conductive pads 290A, dummy lines 2908, and conductive lines 290C, are formed in the inside of the second trenches T2. The conductive pads 290A are coupled with the second contact plugs 270, which are coupled with the well-pickup contact pads 250. The dummy lines 290B are formed on both sides of each conductive pad 290A to secure process margin. The conductive lines 290C are coupled with the second contact plugs 270, which are coupled with the first contact plugs 230, respectively.

The conductive pads 290A, the dummy lines 290B, and the conductive lines 290C may be formed by depositing a conductive material, such as doped polysilicon, metal, or metal nitride, in a thickness that fills the second trenches T2 and then performing a planarization process, such as a CMP process, until the upper surface of the fourth insulation layer 280 is exposed.

According to the semiconductor device and the fabrication method thereof in accordance with one embodiment of the present invention described above, misalignment occurring at the ends of a series of drain contacts may be prevented. The size of well-pickup contacts may be decreased by forming contact plugs that are coupled with drain regions with the same distance to the well-pickup contact region without additionally forming well-pickup contact plugs and using the contact plugs as well-pickup contact plugs. Therefore, loss of a substrate may be minimized while the size of a chip is decreased, and burden of Optical Proximity Correction (OPC) is relieved, which reduces Turn-Around Time (TAT).

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a semiconductor substrate configured to include a plurality of active regions;
a plurality of first contact plugs wherein each active region is coupled with a corresponding first contact plug;
a contact pad configured to couple with some of the plurality of first contact plugs; and
a number of lines which are coupled with the others of the plurality of first contact plugs, respectively.

2. The semiconductor device of claim 1, wherein the first contact plugs are coupled with drain regions of the active regions, respectively.

3. The semiconductor device of claim 1, wherein the first contact plugs are arrayed along more than two rows that are stretched in a direction crossing the active regions, and neighboring first contact plugs are disposed in different rows.

4. The semiconductor device of claim 1, wherein the contact pad couples first contact plugs that are formed in a well-pickup contact region among the multiple first contact plugs with each other.

5. The semiconductor device of claim 4, wherein the contact pad couples with upper ends of the first contact plugs that are formed in the well-pickup contact region.

6. The semiconductor device of claim 1, further comprising: a plurality of second contact plugs that are coupled with the contact pad or the first contact plugs that are not coupled with the contact pad.

7. The semiconductor device of claim 6, wherein the second contact plugs are disposed over the first contact plugs.

8. The semiconductor device of claim 6, further comprising: conductive patterns that are coupled with the second contact plugs.

9. The semiconductor device of claim 1, wherein a space between the contact pad and the first contact plugs that are adjacent to right and left sides of the contact pad is the same as the space between the first contact plugs.

10. The semiconductor device of claim 1, wherein the plurality of first contact plugs arrayed with the same space from each other.

11. A method for fabricating a semiconductor device, comprising:
forming an isolation layer for defining a plurality of active regions in a semiconductor substrate;
forming a plurality of first contact plugs so that each active region is coupled with a corresponding first contact plug;
forming a contact pad for coupling with some of the plurality of first contact plugs; and
forming a number of lines which are coupled with the others of the plurality of first contact plugs, respectively.

12. The method of claim 11, wherein the first contact plugs are formed to be coupled with drain regions of the active regions, respectively.

13. The method of claim 11, wherein the first contact plugs are arrayed along more than two rows that are stretched in a direction crossing the active regions, and neighboring first contact plugs are disposed in different rows.

14. The method of claim 11, wherein the contact pad couples first contact plugs that are formed in a well-pickup contact region among the multiple first contact plugs with each other.

15. The method of claim 14, wherein the contact pad couples upper ends of the first contact plugs that are formed in the well-pickup contact region with each other.

16. The method of claim 11, further comprising: forming a plurality of second contact plugs that are coupled with the contact pad or the first contact plugs that are not coupled with the contact pad, after the forming of the contact pad.

17. The method of claim 16, wherein the second contact plugs are formed over the first contact plugs.

18. The method of claim 16, further comprising: forming conductive patterns that are coupled with the second contact plugs, after the forming of the second contact plugs.

19. The method of claim 11, wherein a space between the contact pad and the first contact plugs that are adjacent to right and left sides of the contact pad is the same as the space between the first contact plugs.

20. The method of claim 11, wherein the first contact plugs and the contact pad are formed of an identical material.

* * * * *